US012356593B2

(12) United States Patent
MacNeill et al.

(10) Patent No.: US 12,356,593 B2
(45) Date of Patent: Jul. 8, 2025

(54) SYSTEMS AND METHODS FOR COOLING IN POWER DISTRIBUTION CENTERS

(71) Applicant: Integra Mission Critical, LLC, Dallas, TX (US)

(72) Inventors: Gregory MacNeill, Plano, TX (US); John Kolar, Clearwater, FL (US); Thomas Neuman, Dallas, TX (US); John A. Musilli, Jr., San Diego, CA (US)

(73) Assignee: Integra Mission Critical, LLC, Dallas, TX (US)

( * ) Notice: Subject to any disclaimer, the term of this patent is extended or adjusted under 35 U.S.C. 154(b) by 377 days.

(21) Appl. No.: 17/845,845

(22) Filed: Jun. 21, 2022

(65) Prior Publication Data

US 2022/0408604 A1    Dec. 22, 2022

Related U.S. Application Data

(60) Provisional application No. 63/213,416, filed on Jun. 22, 2021.

(51) Int. Cl.
    *H05K 7/20*      (2006.01)
(52) U.S. Cl.
    CPC ............... *H05K 7/20745* (2013.01)
(58) Field of Classification Search
    CPC .................................. H05K 7/20745
    See application file for complete search history.

(56) References Cited

U.S. PATENT DOCUMENTS

| 7,752,858 B2* | 7/2010 | Johnson ............ H05K 7/20836 62/186 |
|---|---|---|
| 8,403,736 B2 | 3/2013 | Rasmussen et al. |
| 9,596,790 B2 | 3/2017 | Ambriz |
| 9,915,453 B2 | 3/2018 | Moses |

(Continued)

FOREIGN PATENT DOCUMENTS

| DE | 102018110070 A1 | 9/2019 |
|---|---|---|
| WO | 2004049773 A2 | 6/2004 |
| WO | 2015117521 A1 | 8/2015 |

OTHER PUBLICATIONS

International Search Report and Written Opinion issued Sep. 14, 2022 regarding International Application No. PCT/US22/73099, 8 pages.

(Continued)

*Primary Examiner* — Mukundbhai G Patel

(57) ABSTRACT

A power distribution center includes a housing comprising multiple walls and multiple openings, one or more UPS modules and battery racks, and at least one exhaust air duct disposed above the one or more UPS modules and battery racks. The at least one exhaust air duct has an outlet aligned with at least one first opening. The power distribution center is configured to receive cooling air from outside the power distribution center and convey the cooling air to the one or more UPS modules and battery racks. The one or more UPS modules and battery racks are configured to transfer thermal energy to the cooling air, thereby creating heated exhaust air. The at least one exhaust air duct is configured to receive and convey the heated exhaust air to the at least one first opening to expel the heated exhaust air to an exterior space.

20 Claims, 14 Drawing Sheets

(56) References Cited

U.S. PATENT DOCUMENTS

| | | |
|---|---|---|
| 10,512,196 B2 | 12/2019 | Song et al. |
| 10,522,801 B2* | 12/2019 | Kronke ............... H01M 10/647 |
| 2011/0300788 A1* | 12/2011 | Caveney ............ H05K 7/20572 |
| | | 454/184 |
| 2013/0133350 A1 | 5/2013 | Reytblat |
| 2021/0345526 A1* | 11/2021 | Thornton ........... H05K 7/20145 |

OTHER PUBLICATIONS

Frigel Intelligent Process Cooling, "Ecodry the Most Efficient Adiabatic Cooler", Ecodry-3DK, Aug. 17, 2021, 11 pages.
Extended European Search Report issued Apr. 7, 2025 regarding Application No. 22829505.1, 9 pages.

* cited by examiner

SYSTEMS AND METHODS FOR COOLING IN POWER DISTRIBUTION CENTERS

CROSS-REFERENCE TO RELATED APPLICATIONS AND PRIORITY CLAIM

This application claims priority under 35 U.S.C. § 119(e) to U.S. Provisional Patent Application No. 63/213,416 filed on Jun. 22, 2021, which is hereby incorporated by reference in its entirety.

TECHNICAL FIELD

Embodiments of the present disclosure relate to cooling systems and, in particular, to systems and methods for cooling in power distribution centers.

BACKGROUND

Data centers often include external power distribution centers that are located outside, but adjacent to, the data center facility. Such power distribution centers house equipment for powering the data center, such as an uninterruptible power supply (UPS) module. Due to the large amount of thermal energy (i.e., heat) generated by such equipment, power distribution centers typically employ mechanical refrigeration, which results in high energy usage and high installation costs.

SUMMARY

This disclosure provides control systems and methods for cooling in power distribution centers.

In a first embodiment, a power distribution center includes a housing comprising multiple walls and multiple openings in the walls. The power distribution center also includes one or more UPS modules and one or more battery racks disposed within the housing. The power distribution center further includes at least one exhaust air duct disposed above the one or more UPS modules and the one or more battery racks, the at least one exhaust air duct having an outlet aligned with at least one first opening of the multiple openings. The power distribution center is configured to receive, through at least one second opening of the multiple openings, cooling air from outside the power distribution center and convey the cooling air to the one or more UPS modules and the one or more battery racks. The one or more UPS modules and the one or more battery racks are configured to transfer thermal energy to the cooling air during operation, thereby creating heated exhaust air. The at least one exhaust air duct is configured to receive the heated exhaust air from the one or more UPS modules and one or more battery racks and convey the heated exhaust air to the at least one first opening in order to expel the heated exhaust air to an exterior space.

In a second embodiment, a method includes receiving, through at least one second opening of multiple openings disposed in multiple walls of a power distribution center, cooling air from outside the power distribution center and conveying the cooling air to one or more uninterruptible power supply (UPS) modules and one or more battery racks disposed within the power distribution center. The method also includes transferring thermal energy to the cooling air from the one or more UPS modules and the one or more battery racks, thereby creating heated exhaust air. The method further includes receiving the heated exhaust air from the one or more UPS modules and one or more battery racks by at least one exhaust air duct disposed above the one or more UPS modules and the one or more battery racks and conveying the heated exhaust air to an outlet aligned with at least one first opening of the multiple openings in order to expel the heated exhaust air to an exterior space.

Other technical features may be readily apparent to one skilled in the art from the following figures, descriptions, and claims.

DETAILED DESCRIPTION

FIGS. 1 through 14, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

For simplicity and clarity, some features and components are not explicitly shown in every figure, including those illustrated in connection with other figures. It will be understood that all features illustrated in the figures may be employed in any of the embodiments described. Omission of a feature or component from a particular figure is for purposes of simplicity and clarity and is not meant to imply that the feature or component cannot be employed in the embodiments described in connection with that figure. It will be understood that embodiments of this disclosure may include anyone, more than one, or all of the features described here. Also, embodiments of this disclosure may additionally or alternatively include other features not listed here.

In data center facilities, PDCs are electrical rooms that house uninterruptible power supply (UPS) modules and batteries. Conventional PDCs typically employ specialized additional cooling systems (e.g., DX (direct expansion) cooling, also referred to as split system cooling) that maintain the ambient air temperature inside the room between 77° F. to 104 F, depending on the type of batteries and UPS module installed. This cooling equipment requires additional design effort, floorspace, capital outlay, and maintenance. The energy cost required to operate the cooling equipment on a 7×24 hour basis to cool the parasitic loads that are inherent in the UPS equipment designs is significant.

The active air conditioning typically occurs regardless of outside ambient air temperatures. Traditional PDCs and electrical modules allow the supply air and exhaust air from the heat-producing equipment (including UPS, charging/discharging batteries, switch gear, and transformers) to mix inside the PDC without separation or segregation. This mixing requires dilution of the hot exhaust with cold supply air to reach the prescribed equipment entering air temperature (EAT). This standard industry condition requires at least 200% the air volume at a reduced temperature to meet the prescribed EAT.

To address these and other issues, embodiments of the present disclosure provide systems and methods for cooling in PDCs.

Figure 1:
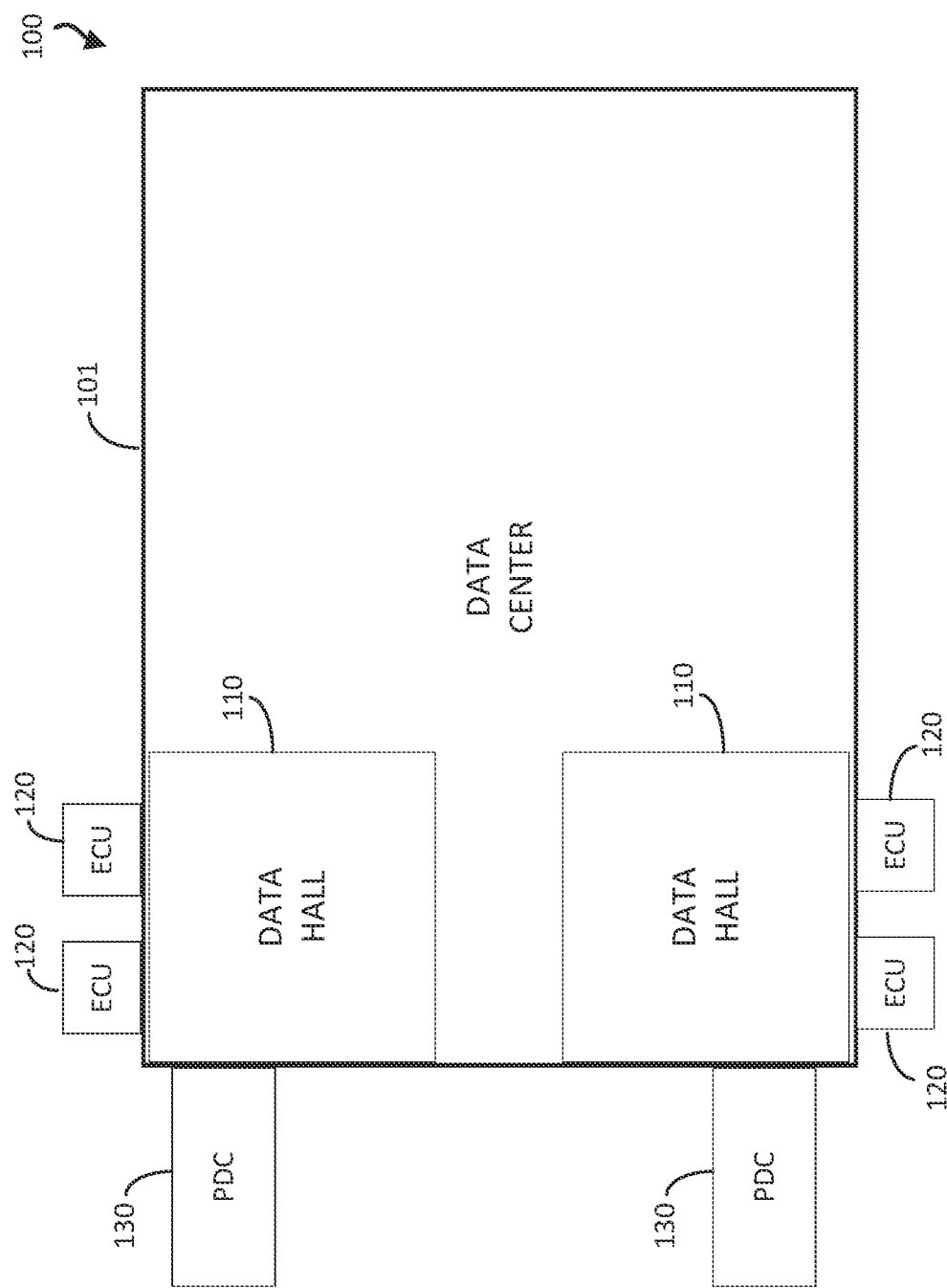
FIG. 1 illustrates an example system in which systems and methods for cooling in power distribution centers (PDCs) can be implemented according to this disclosure.

FIG. 1 illustrates an example system 100 in which systems and methods for cooling in PDCs can be implemented according to this disclosure. The embodiment of the system 100 shown in FIG. 1 is for illustration only. Other embodiments of the system 100 could be used without departing from the scope of this disclosure.

As shown in FIG. 1, the system 100 includes a data center 101. Inside the data center 101 are multiple data halls 110. Each data hall 110 represents at least a portion of the data center 101 that forms a substantially separate enclosed space. Each data hall 110 houses multiple servers and/or other computing equipment that are arranged in racks. As known in the art, the servers generate substantial amounts of thermal energy that tend to heat the space inside the data hall 110. Each data hall 110 therefore requiring cooling to maintain the temperature of the data hall 110 at a suitable level for proper operation of the servers and for comfort of any human personnel inside the data hall 110. In some embodiments, each data hall 110 includes one or more dedicated enterprise cooling units (ECUs) 120 that generate cooled air. The ECUs 120 represent any suitable system(s) or device(s) (including chilled water, indirect evaporative cooling, direct outside air with trimming coils, etc.) for generating cooled air for cooling the data halls 110. In some embodiments, the ECUs 120 are direct evaporative cooling units.

Each data hall 110 is also associated with one or more PDCs 130. Each PDC 130 houses power equipment and other related equipment for powering the components inside the data hall 110. Typically, each PDC 130 houses equipment dedicated for use by one data hall 110 However, in some embodiments, a PDC 130 could house equipment for multiple data halls 110. Each PDC 130 is approximately 9.5 ft wide×45 ft long×9 ft. tall, although the PDC 130 may be any suitable size, including larger or smaller sizes. The PDC 130 may be a single enclosure or a group of enclosures connected in blocks configured in parallel, linear, square, rectangle, hub and spoke, stacked, and the like. The ECUs 120 and the PDCs 130 are located outside of the building comprising the data center 101.

Inside the data hall 110, cooled air from the ECU 120 enters through vents or ducts, cools the interior space of the data hall 110, and the used air is expelled outside of the data hall 110, such as through a drop ceiling plenum. In addition, some of the cooled air can be drawn to the PDC 130 with fan assist. In some embodiments, one or more ECUs 120 can be configured to provides additional bypass cooled air, which can be deployed to cool electrical equipment in one or more of the PDCs 130. While FIG. 1 shows the data center 101 with two data halls 110, each having two ECUs 120 and one PDC 130, this is merely one example. In other embodiments, the data center 101 could include other numbers of data halls 110, ECUs 120, and PDCs 130.

Figure 2:
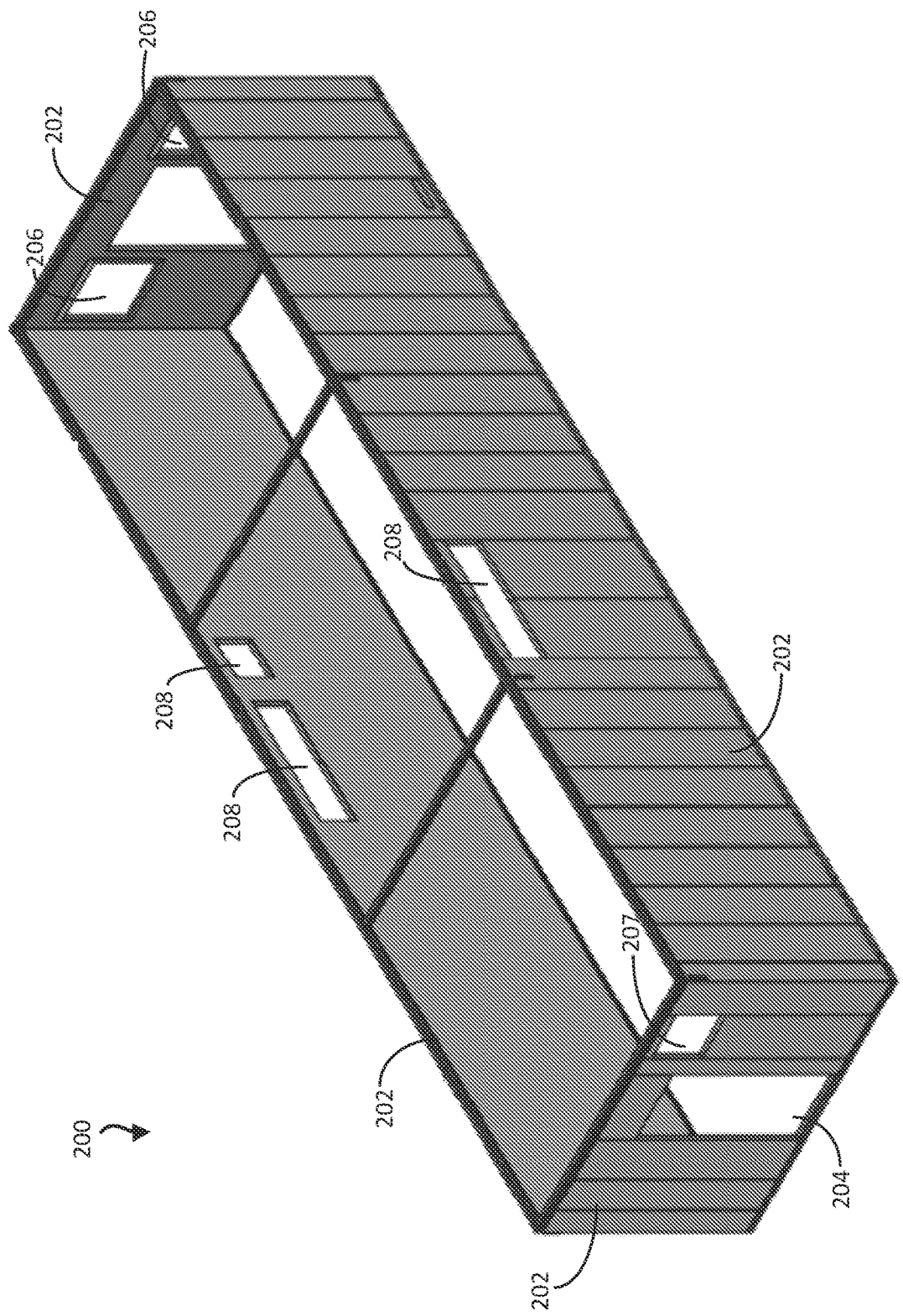
FIG. 2 illustrates an isometric view of an example PDC housing according to this disclosure.

FIG. 2 illustrates an isometric view of an example PDC housing 200 according to this disclosure. In some embodiments, the PDC housing 200 represents a housing for one of the PDCs 130 of FIG. 1. The embodiment of the PDC housing 200 shown in FIG. 2 is for illustration only. Other embodiments of the PDC housing 200 could be used without departing from the scope of this disclosure.

As shown in FIG. 2, the PDC housing 200 includes multiple walls 202 that form an enclosure comprising the PDC housing 200. While not specifically shown in FIG. 2, the PDC housing 200 typically includes a floor disposed below the walls 202 and a roof disposed above the walls 202 to form a substantially enclosed space. Within one wall 202 is a doorway 204 through which personnel can enter the PDC housing 200. The walls 202 also include multiple openings 206-208 that permit airflow into and out of the PDC housing 200. In some embodiments, the openings 206 allow for airflow into the PDC housing 200, and the openings 207-208 allow for airflow out of the PDC housing 200. Of course, this is merely one example. In other embodiments, one or more openings 206 could allow for airflow out of the PDC housing 200 and/or one or more of the openings 207-208 could allow for airflow into the PDC housing 200. Further details regarding the openings 206-208 and corresponding airflow are provided below with respect to other figures.

Figure 3:
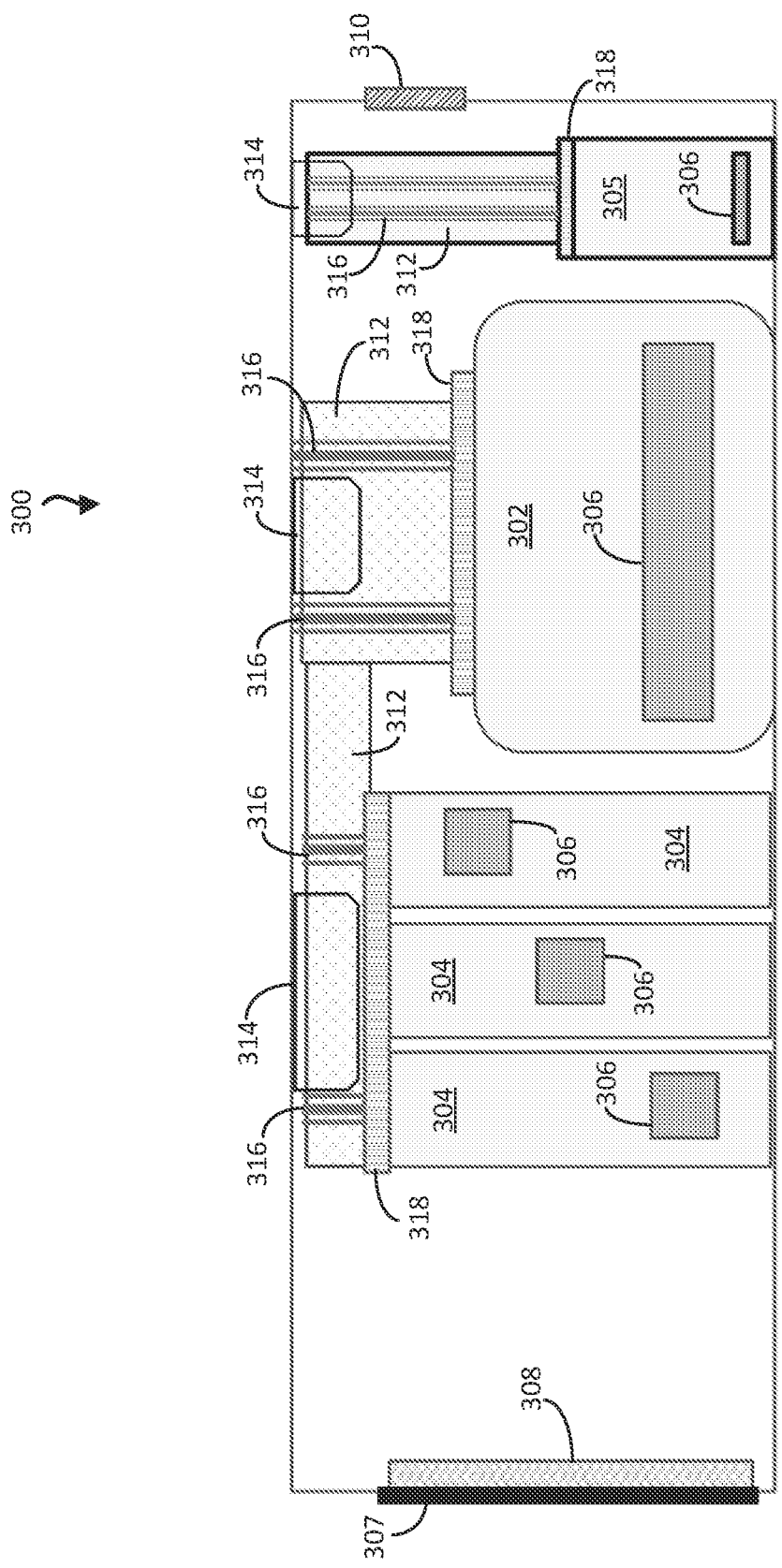
FIGS. 3 and 4 illustrate an example PDC according to this disclosure.
Figure 4:
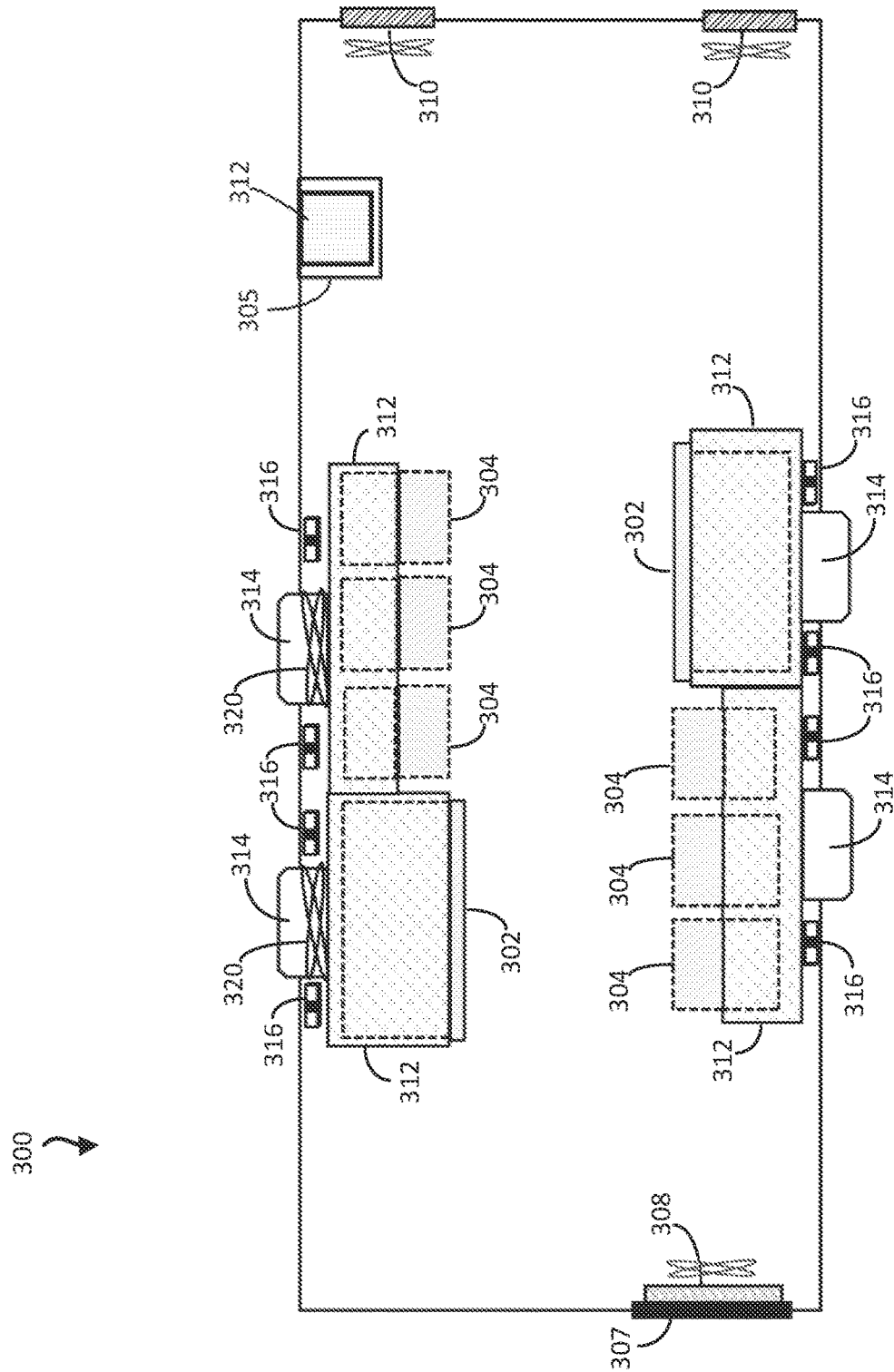

FIGS. 3 and 4 illustrate an example PDC 300 according to this disclosure. Specifically, FIG. 3 shows a side view of the PDC 300, and FIG. 4 shows a top view of the PDC 300. In some embodiments, the PDC 300 represents one of the PDCs 130 of FIG. 1 and is housed in a PDC housing 200. The embodiment of the PDC 300 shown in FIGS. 3 and 4 is for illustration only. Other embodiments of the PDC 300 could be used without departing from the scope of this disclosure.

As shown in FIGS. 3 and 4, the PDC 300 houses one or more UPS modules 302, which are electrically coupled to one or more UPS battery racks 304 and one or more transformers 305. During normal operations of the data hall 110, the UPS modules 302 and the transformer 305 are in a substantially active state generating significant heat, while the UPS battery racks 304 are in a substantially dormant state and do not generate significant heat. In the event of a power interruption or failure at the data hall 110, the UPS modules 302 change modes and continue to generate significant heat, and the UPS battery racks 304 are brought online and begin discharging and producing significant heat while generating power for the data hall 110. The UPS modules 302 and the UPS battery racks 304 generate significant amounts of heat that must be eliminated in order to keep the UPS modules 302 and UPS battery racks 304 within the prescribed temperature range. The UPS modules 302, the UPS battery racks 304, and the transformer 305 include one or more supply air vents 306 disposed in an exterior surface to allow cooling air to flow into the UPS modules 302, the UPS battery racks 304, and the transformer 305 in order to cool these components.

At one end of the PDC 300 is one or more openings 307, which can represent the openings 206 of FIG. 2. While FIG. 3 shows one opening 307 in a wall, the one or more openings 307 can additionally or alternatively include openings in the ceiling or floor system. Adjacent to the openings 307 is one or more wall mounted cooling coils 308. Air entering the PDC 300 through the openings 307 can flow over or through the cooling coils 308. In some embodiments, one or more fans disposed upstream or downstream of the cooling coils 308 can promote active air flow.

At the other end of the PDC 300 is one or more openings 310, which can represent the opening 207 of FIG. 2. Some of the air within the PDC 300, such as heated exhaust air, can be exhausted through the openings 310. In some embodiments, one or more exhaust fans can be disposed adjacent to the openings 310 to promote air movement. In some embodiments, the openings 310 can include powered or gravity dampers that open when airflow is present.

Disposed above the UPS modules 302, the UPS battery racks 304, and the transformer 305 are exhaust air ducts 312 that receive heated exhaust air generated and expelled by the UPS modules 302, the UPS battery racks 304, and the transformer 305. The exhaust air ducts 312 carry the exhaust air to openings 314 in the walls, roof, floor, or underside of the PDC 300, where the exhaust air can be exhausted from the PDC 300 to the outside. In some embodiments, the openings 314 can represent the openings 208 of FIG. 2. In some embodiments, the exhaust air ducts 312 are insulated to minimize heat transfer through the walls of the exhaust air ducts 312. In some embodiments, exhaust fans 320 are disposed adjacent to the openings 314 to promote movement of air through the openings 314.

In some embodiments, the exhaust air ducts 312 are mounted to adjustable duct sliding rails 316 disposed on the walls of the PDC 300. The sliding rails 316 allow the exhaust air ducts 312 to move up and down as needed to fit closely next to the top surfaces of the UPS modules 302, the UPS battery racks 304, and the transformer 305 from which the heated exhaust air is expelled. Since different models of UPS modules 302, UPS battery racks 304, and transformers 305 can have different vertical dimensions, the sliding rails 316 allow flexibility for connecting the exhaust air ducts 312 to the UPS modules 302, the UPS battery racks 304, and the transformer 305.

For there to be an efficient and effective air transfer through an air duct (in which the amount of air that is bypassed or leaks from ducts is reduced to zero or near zero), special flanges, clamps, screws, nuts and bolts, connection scaling tape, gaskets, sealing compounds, and the like can be used at the inside and outside point of duct connections designed, engineered and constructed with precision by the duct fabricator to achieve a leak proof connection. For the most part, UPS and battery rack manufacturers do not provide pre-engineered and pre-manufactured air duct connection points to their respective equipment. The manufacturers of this type of equipment and racking discourage or dis-incentivize the equipment owner from modifying the manufacturer surface or components to attach duct work with traditional screws, nuts, and bolts, by stating the equipment warranty may or could be voided if the UPS or battery cabinet or transformer case is modified.

In addition to the manufacturer warranty loss, there exists a significant risk of equipment damage to UPS circuitry, components, electrical connections, short circuit failures, and the like, from any task involving drilling holes in the metal cabinet and or dropping screw nuts or bolts in the UPS battery cabinet and/or transformer enclosure.

In some embodiments, one or more flexible air dams 318 are disposed between the UPS modules 302, the UPS battery racks 304, and/or the transformer 305 and their corresponding exhaust air ducts 312. The flexible air dams 318 conform to one or more exterior surfaces of the UPS modules 302, the UPS battery racks 304, and/or the transformer 305 and the corresponding exhaust air ducts 312 (without attaching hardware) in order to generate a more airtight interface between the UPS modules 302, the UPS battery racks 304, and/or the transformer 305 and the corresponding exhaust air ducts 312. In some embodiments, the flexible air dams 318 include a weighted skirt or magnetic edge to further promote close contact between the UPS modules 302, the UPS battery racks 304, and/or the transformer 305 and the corresponding exhaust air ducts 312. In some embodiments, the flexible air dams 318 are capable of producing a seal meeting or exceeding less than 2% leakage or bypass mixing criteria.

As described in greater detail below, the PDC 300 can implement passive and/or active cooling techniques that take advantage of highly efficient, high-volume, evaporative or mechanical cooling that is generated to cool the computing equipment inside the data hall 110. In accordance with data center requirements, cooled supply air is available for the data hall 110 twenty-four hours a day, seven days a week, at temperatures ranging from 72° F. to 104° F. The cooling systems supporting the data hall 110 (e.g., the ECUs 120) pressurize the supply air side of the computer equipment within the data hall 110 by adding more air volume than required by the computer equipment to cool its internal components. This additional air volume is required to prevent hot and cold air mixing at the supply inlets of the computer equipment. The pressurized supply air prevents hot aisle air infiltration or by-pass into the cold aisle. Specialized controls determine the pressure differential between the supply air aisle and the return air aisle to control the system fan speed to maintain a slightly positive pressure in the data hall 110.

This high efficiency cooling solution air supply can be scavenged from the data hall 110 through direct vent passages between the data hall 110 and the PDC 300. Each vent passage coincides with one of the openings 307 and allows direct air flow communication from the data hall 110 to the PDC 300. The air flow is directional from the data hall 110 to the PDC 300, due to the positive air pressure differential between the data hall 110 and the PDC 300. This air supply is available to the UPS modules 302, the UPS battery racks 304, and the transformer 305 as cooling supply air that can be drawn into and through a UPS manufacturer prescribed equipment cooling path to cool the internal components of the UPS modules 302, the UPS battery racks 304, and the transformer 305, thereby generating heated exhaust air.

As previously discussed, in conventional PDC systems, the heated exhaust air would be rejected directly into the enclosed space of the PDC. The heated exhaust air is at a temperature that exceeds the prescribed supply air requirements of the UPS and other electrical room equipment and batteries. Without a way to cool the heated exhaust air or remove the air from the active electrical equipment space, the UPS modules will exceed the upper limits of the prescribed operating thermal envelope, causing a degradation in capacity or transfer of critical power to an unprotected source.

In contrast, in accordance with this disclosure, the PDC 300 includes cooling solutions that provide critical equipment cooling through two or more discrete cooling systems accessible to the critical space or individual targeted component in the space. These cooling systems may utilize any of the heat collection and heat rejection solutions individually or in any combination to meet the prescribed thermal requirements of the space. Depending on the embodiment, for discrete cooling systems, the PDC 300 can include one or more of the following: diverse or common power sources, diverse or common control panels, diverse or common sensor inputs to controls, and diverse or common components.

For example, the PDC 300 can expel heated exhaust air through the exhaust air ducts 312 and the openings 314 to the outside. In some embodiments, the PDC features passive cooling techniques that are cost effective, energy efficient, and space efficient. The passive cooling techniques incorporate one or more passive air movement components, including louvers, dampers, and wall or roof mounted weather hoods, as described in greater detail below. In some embodiments, the PDC 300 also includes active cooling features to further cool the air entering the PDC 300 from the data hall 110, as described in greater detail below. Such active cooling features can include supply fans, exhaust fans, cooling coils, plate heat exchangers, direct liquid cooling features, and the like. This can be important in implementations where independent critical cooling redundancy is required to meet infrastructure design requirements. The physical components and controls comprising the active and passive techniques may represent completely discrete systems, in order to maintain the true redundancy of the critical cooling systems. However, in some embodiments, common components (e.g., metal ductwork) may be shared.

Figure 5:
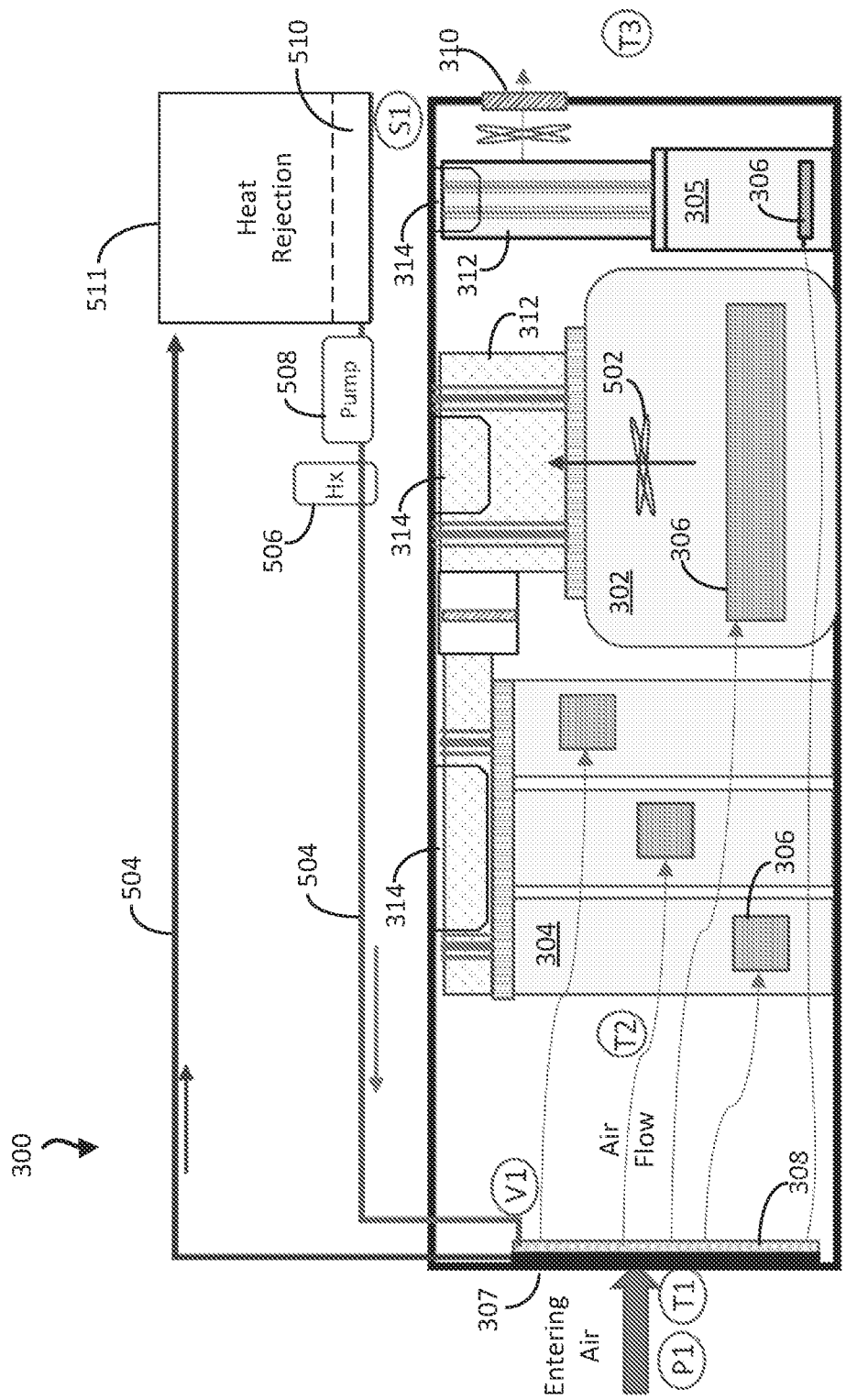
FIGS. 5 and 6 illustrate example operations of airflow in the PDC of FIGS. 3 and 4 according to this disclosure.
Figure 6:
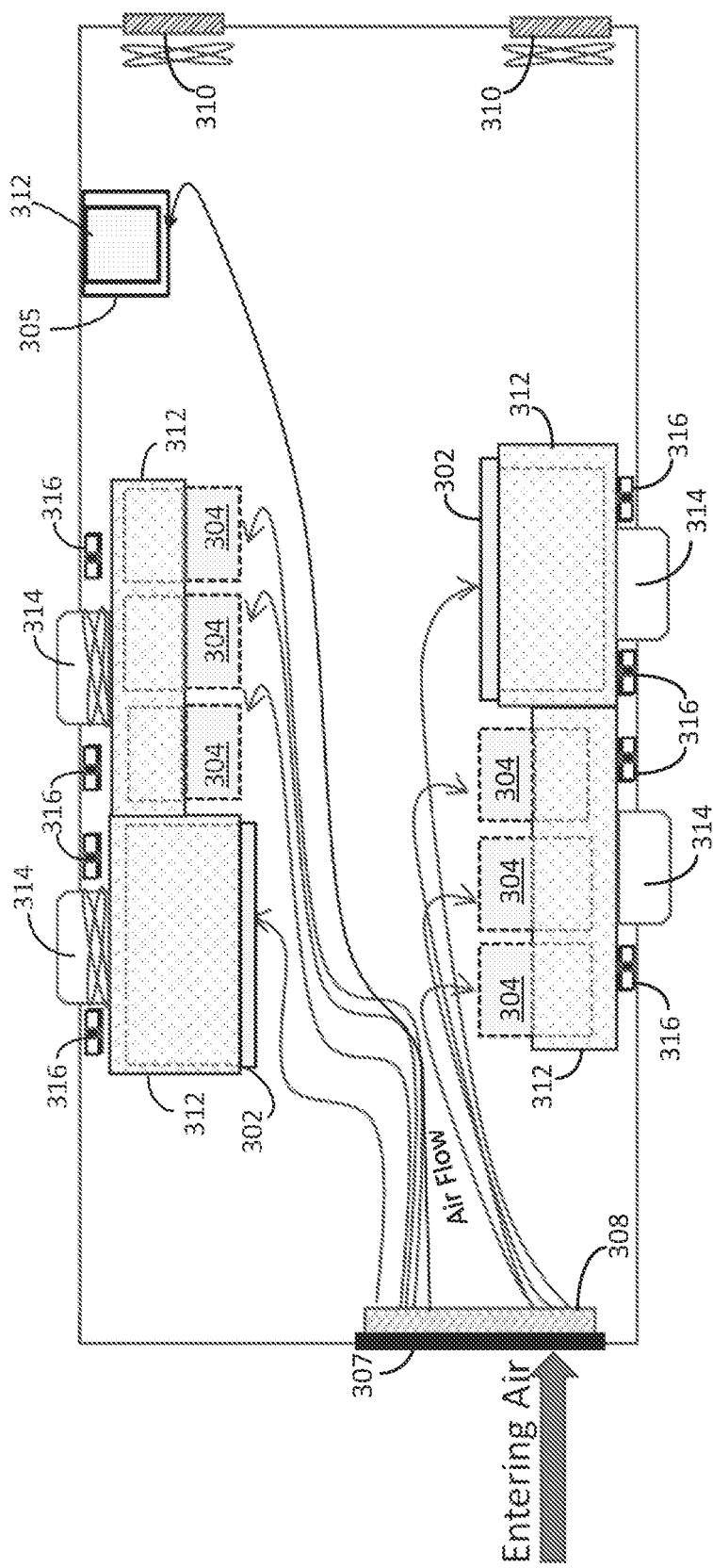

FIGS. 5 and 6 illustrate example operations of airflow in the PDC 300 according to this disclosure. The embodiment of the airflow operations in the PDC 300 shown in FIGS. 5 and 6 is for illustration only. Other embodiments of the airflow operations could be used without departing from the scope of this disclosure.

As shown in FIGS. 5 and 6, cooled air from the data hall 110 or the outside atmosphere enters the PDC 300 through the opening(s) 307. When the cooled air is received from the data hall 110, one or more vent passages or air ducts connecting the opening(s) 307 and one or more outlets in the data hall 110 can facilitate the air flow.

Depending on the embodiment, the cooled air may enter the PDC 300 through passive means or active means. In passive embodiments, the cooled air flows due to pressure differences between the data hall 110 and the PDC 300. That is, the data hall 110 may be more pressurized than the PDC 300, thus causing the cooled air to flow passively. Or outside ambient air may be drawn into the PDC 300 due to lower pressure inside the PDC 300 caused by any exhaust air process. In active embodiments, one or more fans disposed adjacent the openings 307 may push or pull the cooled air into the PDC 300.

Once inside the interior space of the PDC 300, the cooled air flows into the supply air vents 306 of the UPS modules 302, the UPS battery racks 304, and the transformer 305. The cooled air removes thermal energy (heat) surrounding the heat generating components, thereby cooling the UPS modules 302, the UPS battery racks 304, and the transformer 305. The cooled air is heated by absorbing the thermal energy and becomes heated exhaust air. The heated exhaust air flows upward from the UPS modules 302, the UPS battery racks 304, and the transformer 305 into the exhaust air ducts 312, and then is exhausted out of the PDC 300 through the openings 314. One or more fans 502 disposed within or adjacent to the UPS modules 302, the UPS battery racks 304, and the transformer 305 can facilitate air flow through the UPS modules 302 the UPS battery racks 304, and the transformer 305 and into the exhaust air ducts 312.

In some embodiments, the PDC 300 includes the cooling coil(s) 308 disposed adjacent to the openings 307. The cooling coils 308 can be of any suitable size, quantity, and location. In some embodiments, the cooling coils 308 can be mounted into one or more walls, roof, floor, or underside of the PDC 300. Cooling fluid circulates through the cooling coils 308, thereby lowering the temperature of the cooling coils 308. As the air from the data hall 110 (or other cool spaces or outside ambient air) entering the PDC 300 flows over the cooling coils 308, the air is further cooled by the cooled cooling coils 308.

The cooling fluid flows through a loop that can include fluid lines 504, a heat exchanger 506, a pump 508, and a cooled liquid sump 510. During operation, the cooling fluid flows from the cooling coils 308 through the fluid lines 504 through any heat rejection system 511 to the cooled liquid sump 510, where thermal energy received by the cooling fluid at the cooling coils 308 can be released into the heat rejection system 511. The heat rejection system 511 includes any suitable system or structure for receiving or absorbing thermal energy. In some embodiments, the heat rejection system 511 can include one or more of the following: chilled water, phase change material (PCM), direct or indirect evaporative cooling, direct or indirect adiabatic cooling, direct outside air, scavenged supply air from other conditioned or cooled spaces, surface water (e.g., a pond or lake), a district cooling system, and the like.

As shown in FIG. 5, the PDC 300 also includes multiple control devices, including sensors, valves, dampers, pumps, fans, and the like. The sensors can include multiple input and monitoring sensors identifying the conditions inside and outside the PDC 300. The sensors may be placed inside adjacent buildings or rooms and/or around the perimeter of the PDC 300 exposed to the outside ambient environment. In some embodiments, the sensors can measure any or all of the following: air temperature, air pressure, air flow, fluid temperature, fluid flow rate, and the like. In particular, the sensors can measure or identify component status (i.e., active, inactive, fault, error, etc.), position of open or closed range (0% to 100%), speed as a percentage or RPM, fluid level, and the like.

In one aspect of operation, the sensors and control devices operate as follows for a control condition in which the entering air temperature (EAT) does not meet requirements. Temperature sensors T1 and T2 confirm that the supply air entering the PDC 300 through the opening 307 is out of thermal range for cooling the UPS modules 302 and UPS battery racks 304. A notification of fault is sent to operations. A sump fluid level sensor S1 identifies a fluid level in the cooling loop coupled to the cooling coils 308. If the fluid level is acceptable, a controlled valve V1 is commanded to open. A command is sent to start the pump 508. Cooled fluid from the cooled fluid sump 510 is transferred directly to the cooling coils 308, the heat exchanger 506, or both. The pump 508 then continues to operate until one or more the following conditions exist: the sump fluid level drops below specification, the temperature sensor T1 identifies supply air within specification for at least a reference duration, the pump 508 powers off, or the controlled valve V1 closes.

Figure 7:
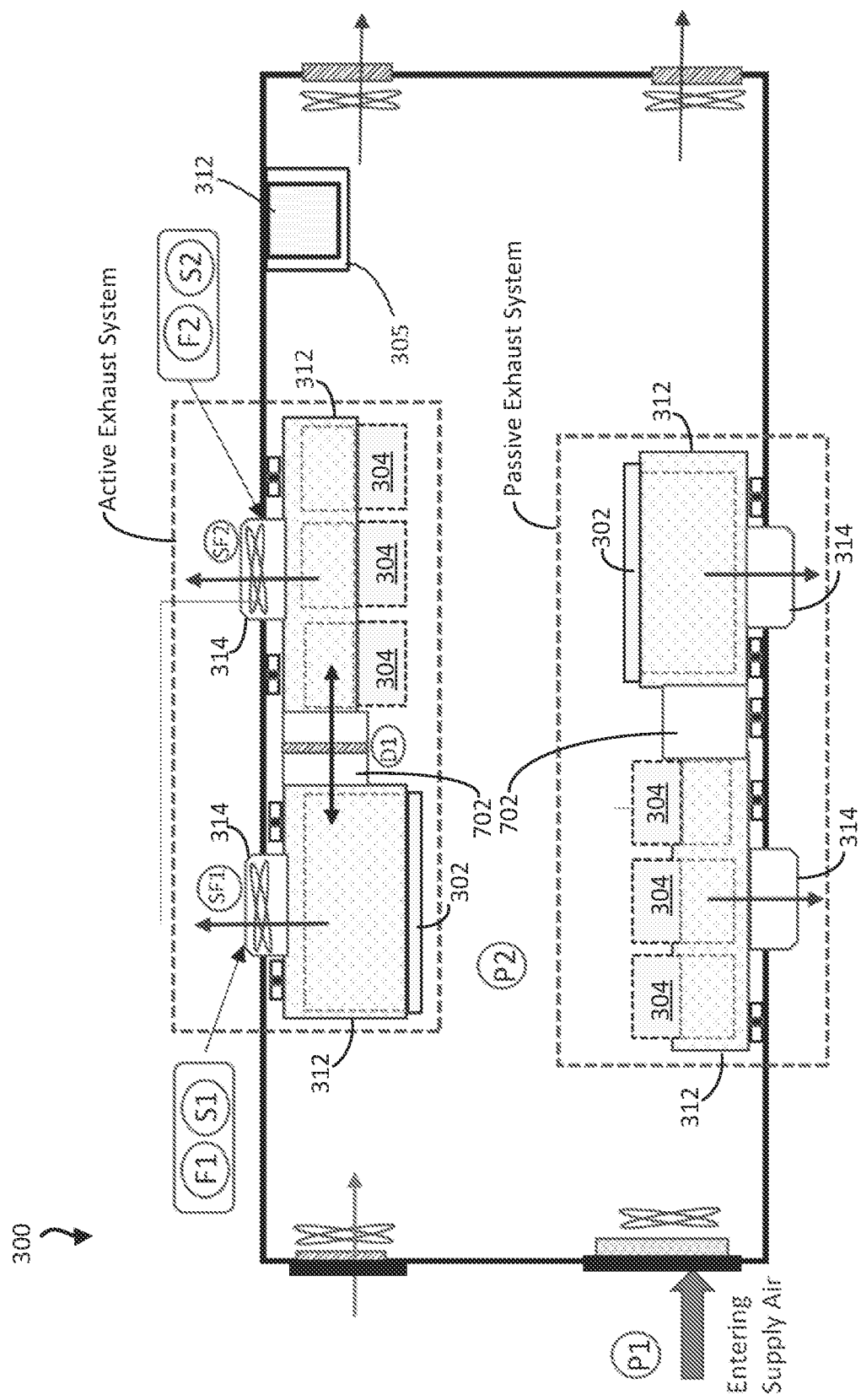
FIG. 7 illustrates additional control operations of the PDC of FIGS. 3 and 4 according to this disclosure.

FIG. 7 illustrates additional control operations of the PDC 300 according to this disclosure. The embodiment of the control operations in the PDC 300 shown in FIG. 7 is for illustration only. Other embodiments of the control operations could be used without departing from the scope of this disclosure.

As shown in FIG. 7, the PDC 300 optionally includes one or more tie ducts 702. Each tie duct 702 is disposed between the exhaust air duct 312 over the UPS modules 302 and the exhaust air duct 312 over the UPS battery racks 304. Within each tie duct 702 is a manually or automatically controlled damper D1. The damper D1 can be operated manually or through a control interface that receives inputs from sensors, programmed responses, and the like.

Each tie duct 702 is provided as a redundancy measure to match the airflow of all attached systems. The purpose of each tie duct 702 is to provide an airflow path during maintenance or emergency situations (e.g., due to an unscheduled loss of a critical active exhaust system). Each tie duct 702 can be designed with a capacity coordinated to corresponding exhaust fans to accommodate the changed air volume.

In one aspect of operation, the sensors and control devices of the PDC 300 operate as follows for a control condition in which the air pressure is greater inside the PDC 300 than outside of the PDC 300. Differences in readings between pressure sensors P1 and P2 indicate that the PDC 300 has a positive internal air pressure relative to the exterior. One or more exhaust dampers on exterior surfaces of the PDC 300 are commanded to open. A command is sent to start one or more fans F1, F2 or system fans SF1, SF2. The speed of each fan is then regulated (e.g., through programming or controls) to maintain a prescribed pressure differential of negative 0.15-0.5 inches water column (inWC) inside the PDC 300.

In another aspect of operation, the sensors and control devices operate as follows for a control condition in which the system fan SF1 is not operating at the prescribed rate. The fan speed sensor S1 identifies a fan operating anomaly for the system fan SF1. A notification of fan fault is sent to operations. A control program opens a controlled damper D1 located inside the tie duct 702. The other system fan SF2 increases speed to compensate for additional exhaust air volume.

Figure 8:
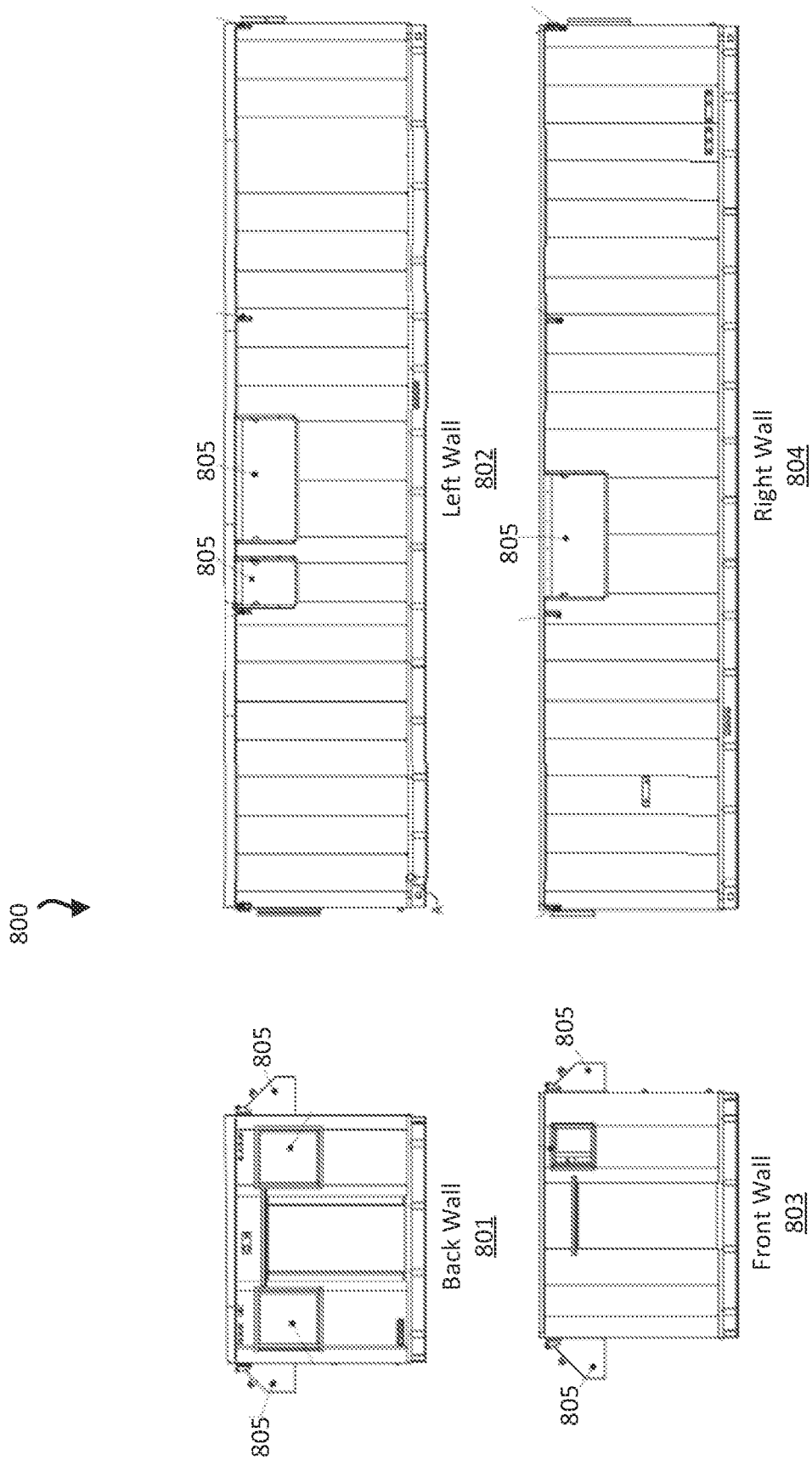
FIG. 8 illustrates exterior elevation views of an example PDC according to this disclosure.

FIG. 8 illustrates exterior elevation views of an example PDC 800 according to this disclosure. In some embodiments, the PDC 800 represents one of the PDCs 130 of FIG. 1 or the PDC 300 of FIGS. 3-7. The embodiment of the PDC 800 shown in FIG. 8 is for illustration only. Other embodiments of the PDC 800 could be used without departing from the scope of this disclosure.

As shown in FIG. 8, the PDC 800 includes a back wall 801, a left wall 802, a front wall 803, and a right wall 804. The walls 801-804 can represent the walls 202 of the PDC housing 200 of FIG. 2. The left wall 802 and the right wall 804 each include at least one hood 805 disposed at or near a top exterior edge of the wall 802, 804 and extending outward from the wall 802, 804. In some embodiments, each hood 805 is fastened (or otherwise attached) directly to the exterior wall 802, 804. Each hood 805 covers an opening (not shown) in the wall 802, 804, such as one of the openings 208 in FIG. 2 or the openings 314 in FIGS. 3-7. The hoods 805 protect the openings from exterior elements, such as dust, rain, wind, insects, rodents, and the like, and hinder such elements from entering into the PDC 800 through the openings.

Figure 9:
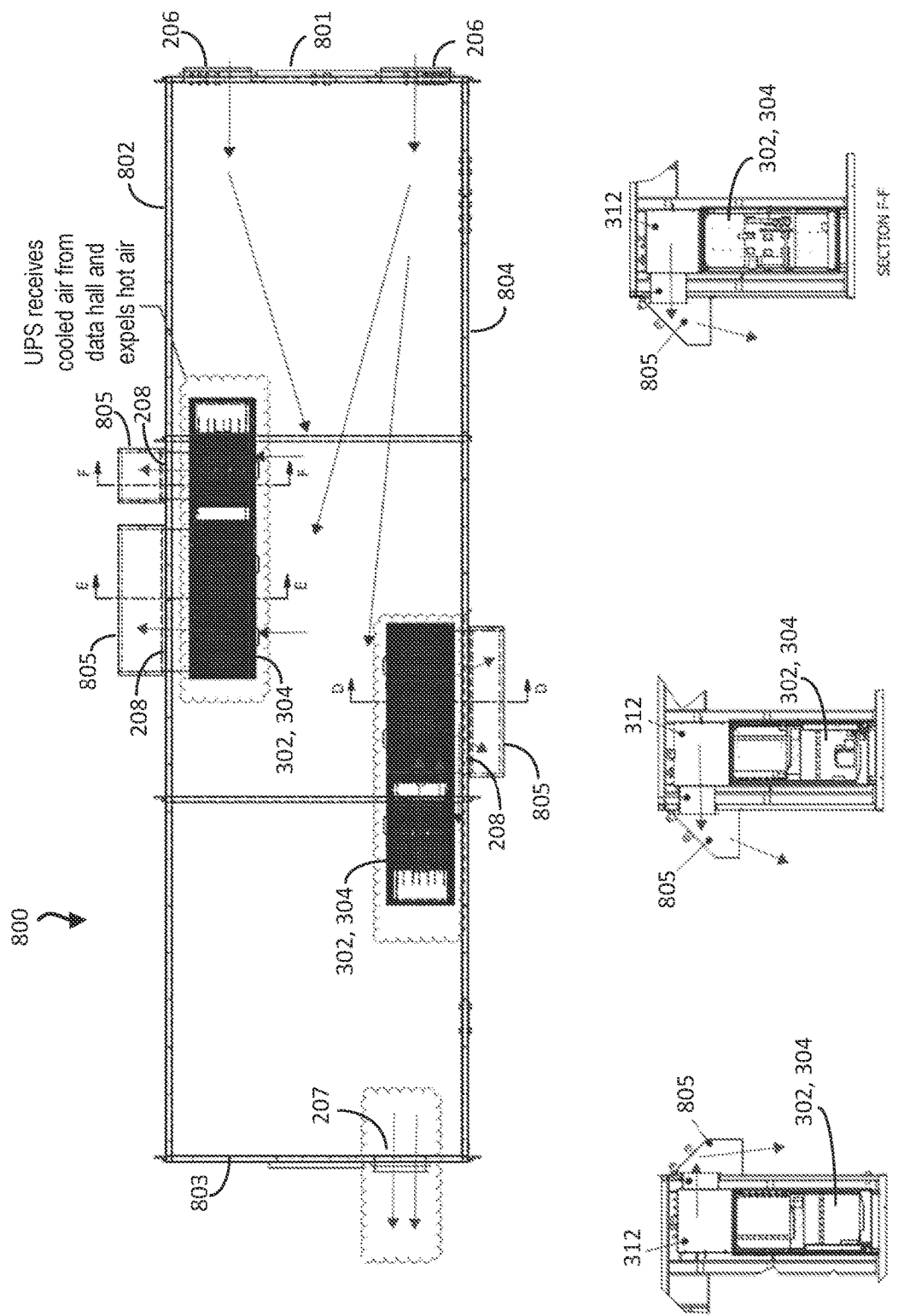
FIG. 9 illustrates a top view and multiple vertical section views of the PDC of FIG. 8 according to this disclosure.

As discussed earlier, heated exhaust air from the UPS modules 302, the UPS battery racks 304, and the transformer 305 can be expelled from the PDC 800 through the wall openings and through openings in the bottom of the hoods 805, as indicated by the arrows such in FIG. 9.

FIG. 9 illustrates a top view and multiple vertical section views of the PDC 800 according to this disclosure. As shown by the arrows in FIG. 9, cooled air flows into the PDC 800 through the openings 206, and then through the UPS modules 302, the UPS battery racks 304, and the transformer 305 to cool those components. The heat from the UPS modules 302, the UPS battery racks 304, and the transformer 305 heats the air, which is then exhausted as heated air through the exhaust air ducts 312, the openings 208, and the hoods 805 to the outside. In addition, some air can be expelled from the PDC 800 through the opening 207.

Figure 10:
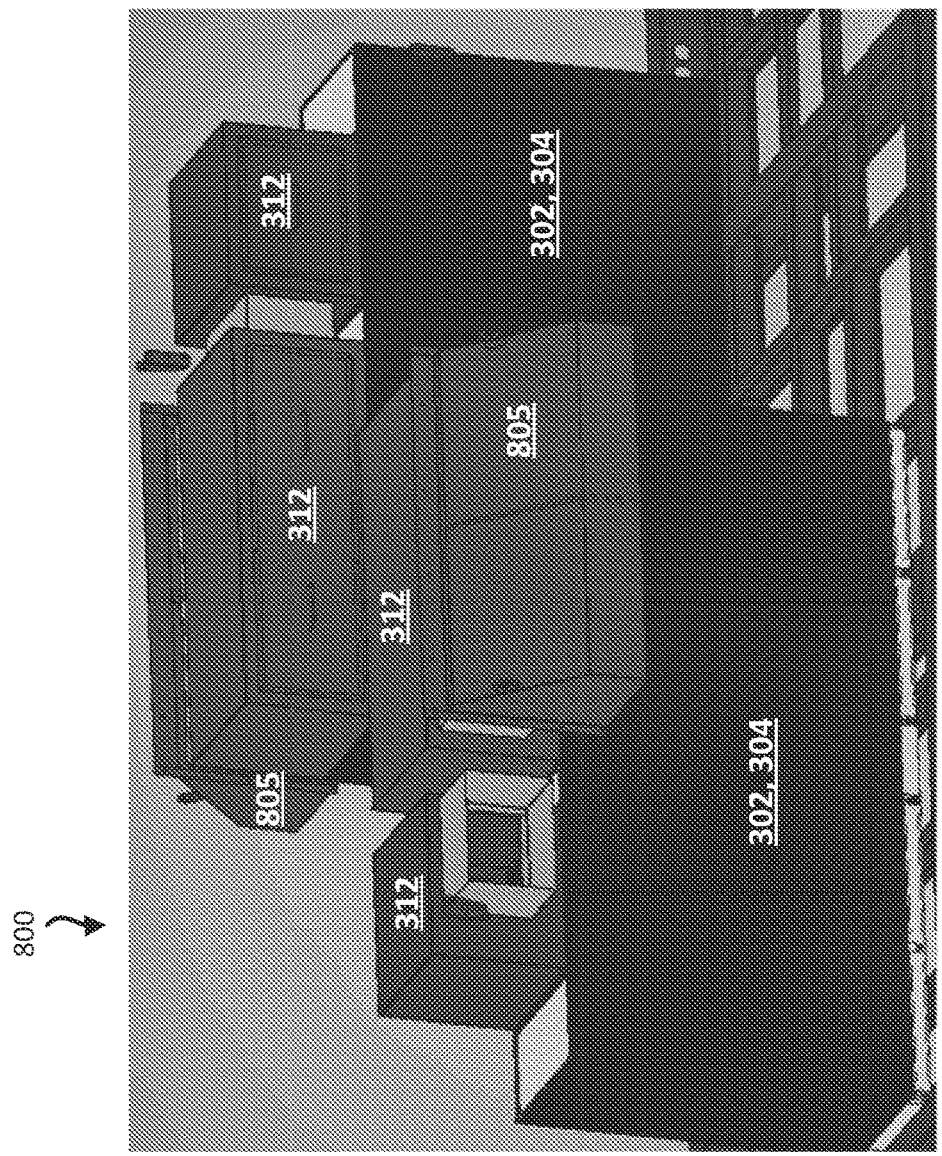
FIG. 10 illustrates a three-dimensional block diagram of portions of the PDC of FIG. 8 according to this disclosure.

FIG. 10 illustrates a three-dimensional block diagram of portions of the PDC 800 according to this disclosure. As shown in FIG. 10, the UPS modules 302 and UPS battery racks 304 are disposed on a floor of the PDC 800. The exhaust air ducts 312 are disposed above the UPS modules 302 and UPS battery racks 304. The hoods 805 cover openings (not shown) in the walls of the PDC 800 but are open at the bottom to allow heated air flowing through the exhaust air ducts 312 and the wall openings.

Figure 11B:
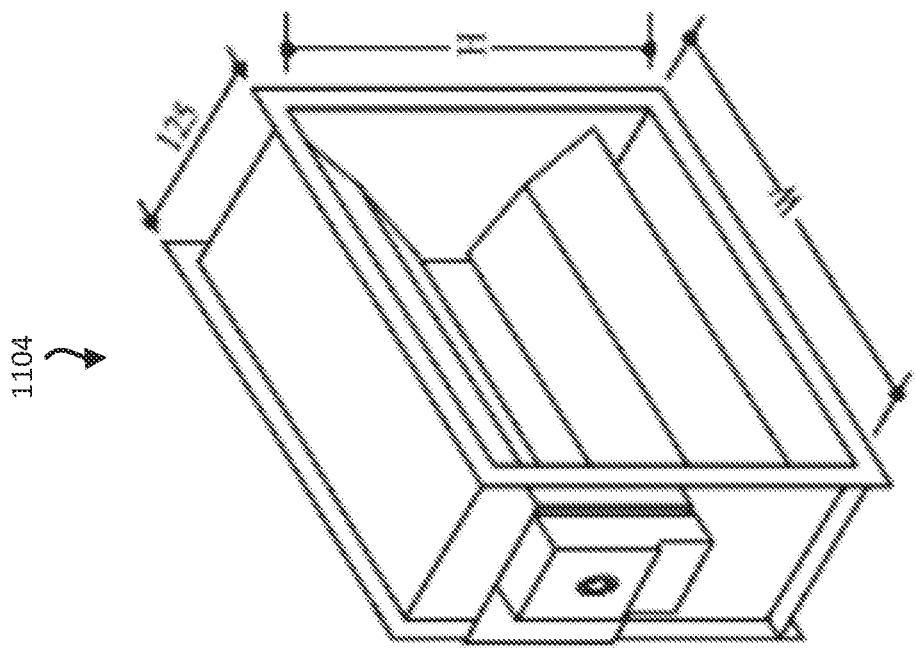
FIGS. 11A and 11B illustrate examples of dampers that can be used in any of the disclosed embodiments.
Figure 11A:
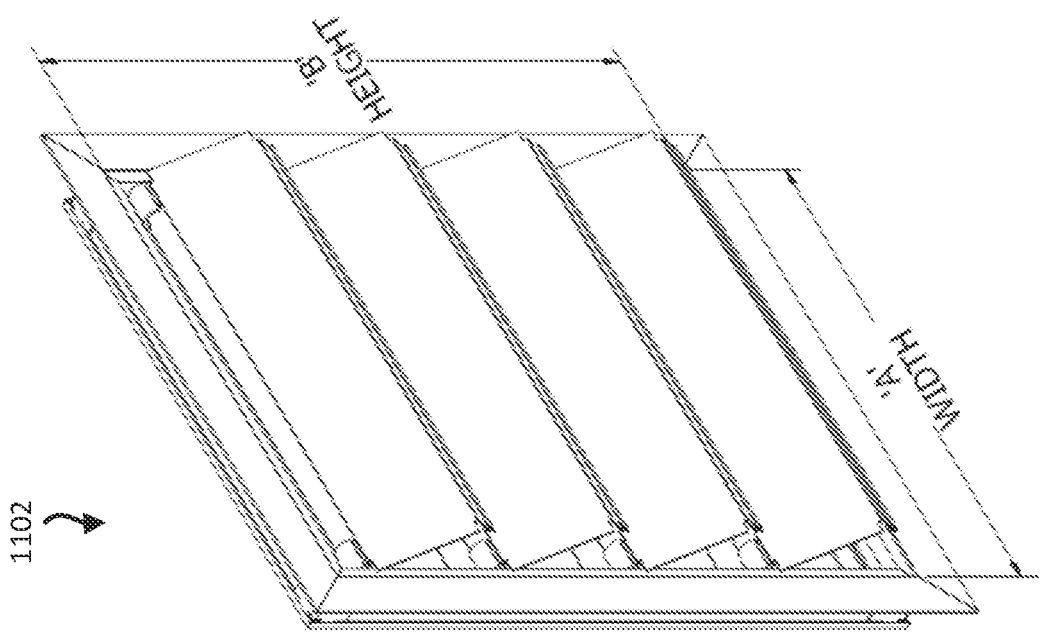

In some embodiments, one or more of the openings 206-208 can include powered or gravity dampers that open when airflow is present. The dampers provide an additional layer of protection against rain, dust, wind, and the like. In some embodiments, the dampers can be installed under the hoods 805. FIGS. 11A and 11B illustrate examples of dampers that can be used in any of the disclosed embodiments. As shown in FIG. 11A, a gravity damper 1102 includes damper blades that fall into a closed position due to gravity. When air is expelled through an opening, the air forces the damper blades open. As shown in FIG. 11B, a powered damper 1104 includes damper blades that are controllably opened and closed as needed.

Figure 12B:
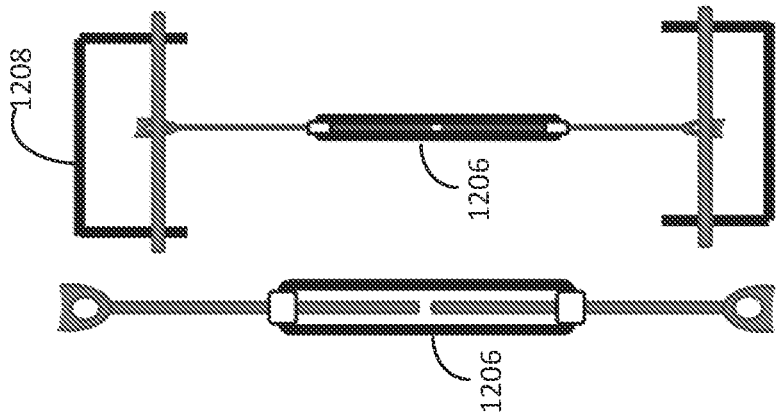
FIGS. 12A and 12B illustrate further details of an example installation of exhaust air ducts according to this disclosure.
Figure 12A:
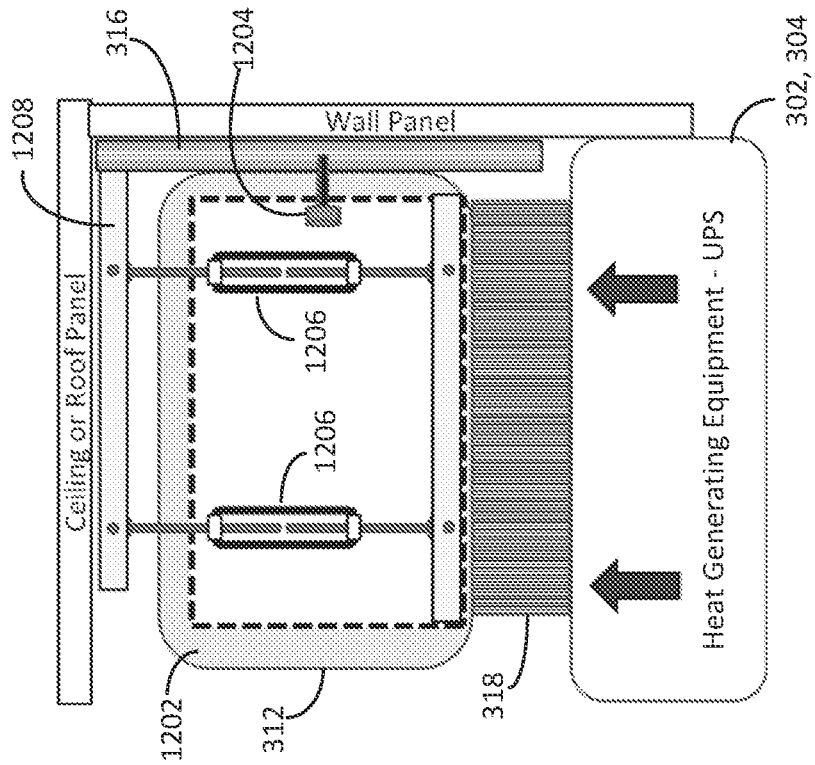

FIGS. 12A and 12B illustrate further details of an example installation of the exhaust air ducts 312 according to this disclosure. As shown in FIG. 12A, each exhaust air duct 312 is formed of any suitable material, such as metal, fiberglass, plastic, or a combination of these. The exhaust air duct 312 is surrounded by a layer of insulation 1202 to minimize heat transfer out of the exhaust air duct 312 through the duct walls. The exhaust air duct 312 can connect to the walls of the PDC via the sliding rails 316, which can include a wall anchoring or mounting slotted bracket with one or more sliding nuts 1204. Additionally, or alternatively, the exhaust air duct 312 can connect to the ceiling of the PDC via one or more adjustable length rods 1206 that couple to ceiling mounting bracket 1208. FIG. 12B illustrates a larger view of the adjustable length rod 1206 and one possible connection to the ceiling mounting bracket 1208.

Although FIGS. 1 through 12B illustrates examples of systems and methods for cooling in PDCs, various changes may be made to FIGS. 1 through 12B. For example, various components in the disclosed systems and methods may be combined, further subdivided, replicated, rearranged, or omitted and additional components may be added according to particular needs. In addition, while FIGS. 1 through 12B illustrate example systems and methods for use in cooling PDCs, the described functionality may be used in any other suitable device or system.

The systems and methods disclosed herein can include one or more computing devices to control various operations. In some embodiments, each computing device may be a service operated by a third party such as a person or a company. Each computing device may be housed and operated at a location different than the location at which the rest of the system is located. That is to say, each computing device is not bound to a specific location.

Figure 13:
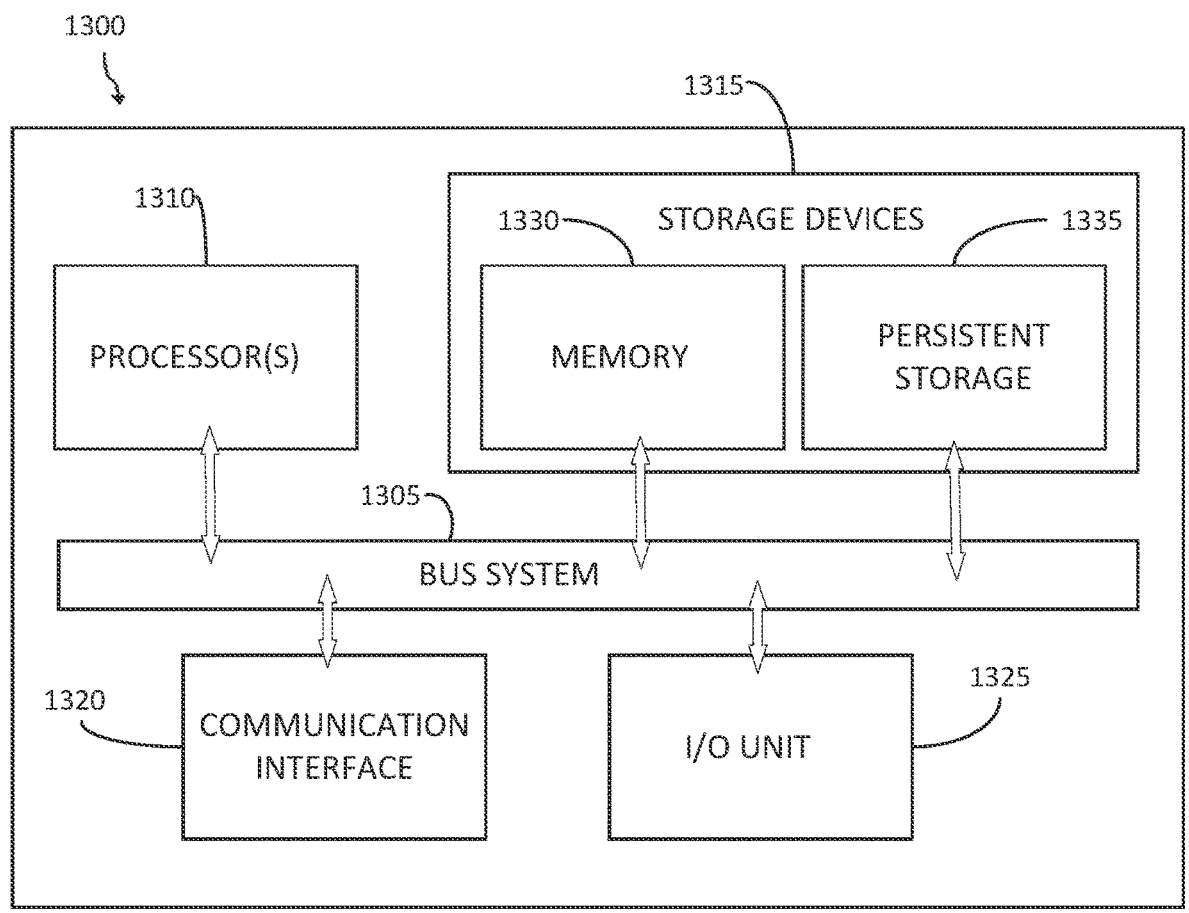
FIG. 13 illustrates an example of a computing device for use in a cooling system according to this disclosure.

FIG. 13 illustrates an example of a computing device 1300 for use in a cooling system according to this disclosure. The computing device 1300 can be configured to control operations in various components in the disclosed systems and methods. For example, the computing device 1300 may control or monitor operations associated with the various control devices (including sensors, valves, dampers, pumps, fans, and the like) described in FIG. 5.

As shown in FIG. 13, the computing device 1300 includes a bus system 1305, which supports communication between processor(s) 1310, storage devices 1315, communication interface (or circuit) 1320, and input/output (I/O) unit 1325. The processor(s) 1310 executes instructions that may be loaded into a memory 1330. The processor(s) 1310 may include any suitable number(s) and type(s) of processors or other devices in any suitable arrangement. Example types of processor(s) 1310 include microprocessors, microcontrollers, digital signal processors, field programmable gate arrays, application specific integrated circuits, and discrete circuitry.

The memory 1330 and a persistent storage 1335 are examples of storage devices 1315, which represent any structure(s) capable of storing and facilitating retrieval of information (such as data, program code, and/or other suitable information on a temporary or permanent basis). The memory 1330 may represent a random-access memory or any other suitable volatile or non-volatile storage device(s). The persistent storage 1335 may contain one or more components or devices supporting longer-term storage of data, such as a read-only memory, hard drive, Flash memory, or optical disc. For example, persistent storage 1335 may store one or more databases of data, standards data, results, data, client applications, etc.

The communication interface 1320 supports communications with other systems or devices. For example, the communication interface 1320 could include a network interface card or a wireless transceiver facilitating communications over any of the systems disclosed herein. The communication interface 1320 may support communications through any suitable physical or wireless communication link(s). The I/O unit 1325 allows for input and output of data. For example, the I/O unit 1325 may provide a connection for user input through a keyboard, mouse, keypad, touchscreen, or other suitable input devices. The I/O unit 1325 may also send output to a display, printer, or other suitable output devices.

Although FIG. 13 illustrates one example of a computing device 1300, various changes may be made to FIG. 13. For example, various components in FIG. 13 could be combined, further subdivided, or omitted and additional components could be added according to particular needs. As a particular example, while depicted as one system, the computing device 1300 may include multiple computing systems that may be remotely located. In another example, different computing systems may provide some or all of the processing, storage, and/or communication resources according to this disclosure.

Figure 14:
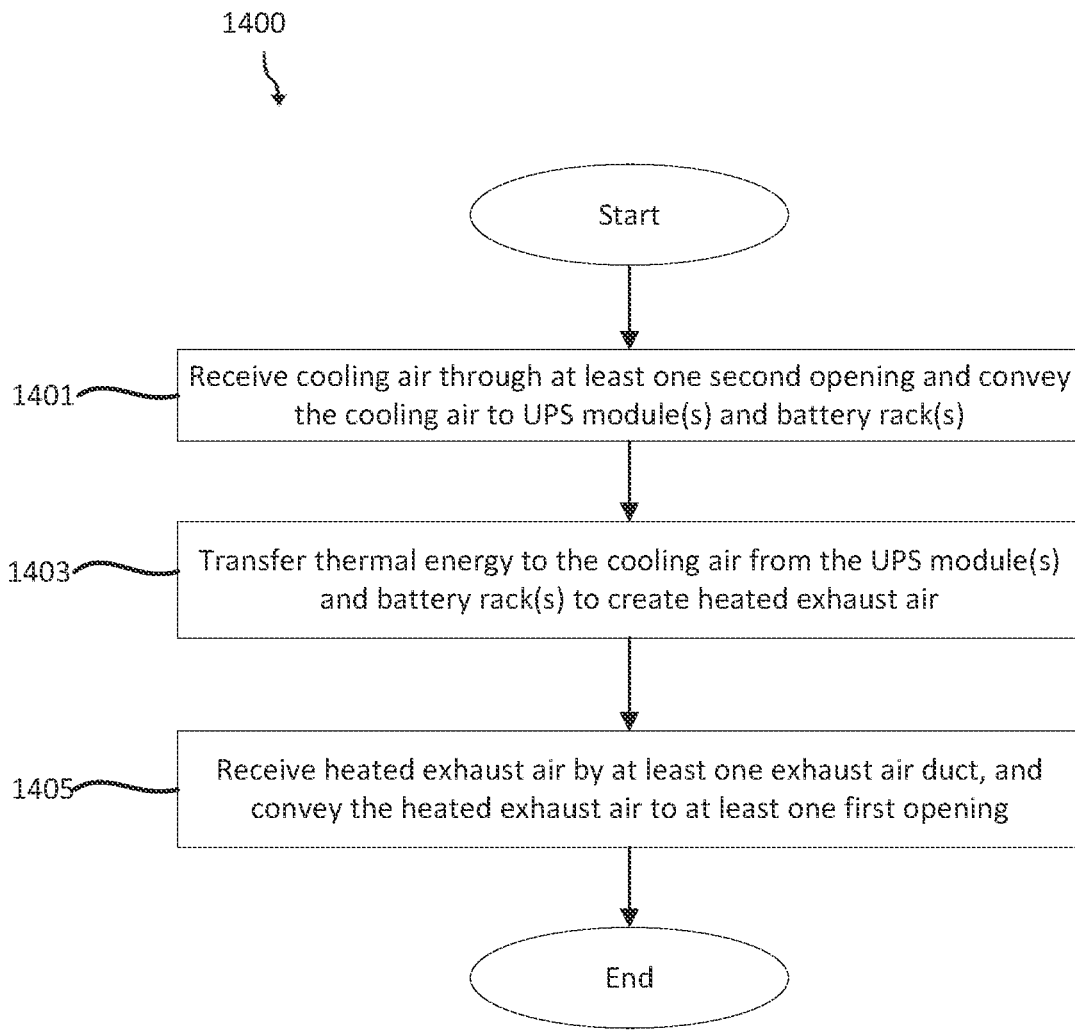
FIG. 14 illustrates an example method for performing cooling operations in a PDC according to various embodiments of the present disclosure.

FIG. 14 illustrates an example method 1400 for performing cooling operations in a PDC according to various embodiments of the present disclosure. For ease of explanation, the method 1400 is described as being performed using the PDC 300 of FIG. 3. However, the method 1400 may be used with any other suitable device or system. The embodiment shown in FIG. 14 is for illustration only. Other embodiments of the method 1400 could be used without departing from the scope of this disclosure.

Referring to FIG. 14, at operation 1401, cooling air from outside a power distribution center is received through at least one second opening of multiple openings disposed in multiple walls of the power distribution center. The cooling air is conveyed to one or more UPS modules and one or more battery racks disposed within the power distribution center. This can include, for example, cooling air from the data hall 110 or the outside atmosphere entering the PDC 300 through the opening(s) 307 and flowing into the supply air vents 306 of the UPS modules 302 and UPS battery racks 304.

At operation 1403, thermal energy is transferred to the cooling air from the one or more UPS modules and the one or more battery racks, thereby creating heated exhaust air. This can include, for example, the cooling air removing thermal energy (heat) surrounding the heat generating components of the UPS modules 302 and UPS battery racks 304, thereby cooling the UPS modules 302 and UPS battery racks 304. The cooling air is heated by absorbing the thermal energy and becomes heated exhaust air.

At operation 1405, the heated exhaust air from the one or more UPS modules and one or more battery racks is received by at least one exhaust air duct disposed above the one or more UPS modules and the one or more battery racks. The heated exhaust air is conveyed to an outlet aligned with at least one first opening of the multiple openings in order to expel the heated exhaust air to an exterior space. This can include, for example, the heated exhaust air flowing upward from the UPS modules 302 and UPS battery racks 304 into the exhaust air ducts 312, and then being exhausted out of the PDC 300 through the openings 314.

The method 1400 illustrates example operations that can be implemented in accordance with the principles of the present disclosure. Various changes could be made to the methods illustrated herein. For example, while shown as a series of steps, various steps in the method 1400 could overlap, occur in parallel, occur in a different order, or occur multiple times. In another example, steps may be omitted or replaced by other steps.

It may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "such as," when used among terms, means that the latter recited term(s) is(are) example(s) and not limitation(s) of the earlier recited term. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Moreover, various functions described herein can be implemented or supported by one or more computer programs, each of which is formed from computer readable program code and embodied in a computer-readable medium. The terms "application" and "program" refer to one or more computer programs, software components, sets of instructions, procedures, functions, objects, classes, instances, related data, or a portion thereof adapted for implementation in a suitable computer readable program code. The phrase "computer-readable program code" includes any type of computer code, including source code, object code, and executable code. The phrase "computer-readable medium" includes any type of medium capable of being accessed by a computer, such as read-only memory (ROM), random access memory (RAM), a hard disk drive, a compact disc (CD), a digital video disc (DVD), or any other type of memory. A "non-transitory" computer-readable medium excludes wired, wireless, optical, or other communication links that transport transitory electrical or other signals. A non-transitory, computer-readable medium includes media where data can be permanently stored and media where data can be stored and later overwritten, such as a rewritable optical disc or an erasable memory device.

Definitions for other certain words and phrases are provided throughout this patent document. Those of ordinary skill in the art should understand that in many if not most instances, such definitions apply to prior as well as future uses of such defined words and phrases. Although the present disclosure has been described with an exemplary embodiment, various changes and modifications may be suggested to one skilled in the art. It is intended that the present disclosure encompass such changes and modifications as fall within the scope of the appended claims. None of the description in this application should be read as implying that any particular element, step, or function is an essential element that must be included in the claim scope. The scope of the patented subject matter is defined by the claims.

What is claimed is:

1. A power distribution center comprising:
   a housing comprising multiple walls and multiple openings in the walls;
   one or more uninterruptible power supply (UPS) modules and one or more battery racks disposed within the housing; and
   at least one exhaust air duct disposed above the one or more UPS modules and the one or more battery racks, the at least one exhaust air duct having an outlet aligned with at least one first opening of the multiple openings,
   wherein the power distribution center is configured to receive, through at least one second opening of the multiple openings, cooling air from outside the power distribution center and convey the cooling air to the one or more UPS modules and the one or more battery racks,
   wherein the one or more UPS modules and the one or more battery racks are configured to transfer thermal energy to the cooling air during operation, thereby creating heated exhaust air, and
   wherein the at least one exhaust air duct is configured to receive the heated exhaust air from the one or more UPS modules and one or more battery racks and convey the heated exhaust air to the at least one first opening in order to expel the heated exhaust air to an exterior space.

2. The power distribution center of claim 1, wherein the at least one exhaust air duct is adjustable in elevation above the one or more UPS modules and the one or more battery racks.

3. The power distribution center of claim 1, wherein the at least one exhaust air duct is mounted to one or more adjustable sliding rails disposed on at least one of the multiple walls, wherein the one or more adjustable sliding rails are configured to enable an adjustment in elevation of the at least one exhaust air duct.

4. The power distribution center of claim 1, wherein the cooling air is received from a data center adjacent to the power distribution center.

5. The power distribution center of claim 4, wherein the cooling air flows from the data center to the power distribution center due to a positive air pressure differential between the data center and the power distribution center.

6. The power distribution center of claim 1, further comprising:
   a flexible air dam disposed between a first exhaust air duct of the at least one exhaust air duct and a first UPS module of the one or more UPS modules, the flexible air dam configured to conform to at least one exterior surface of the first UPS module.

7. The power distribution center of claim 1, further comprising:
   a cooling coil aligned with the at least one second opening, the cooling coil configured to cool the cooling air as the cooling air is received into the power distribution center.

8. The power distribution center of claim 1, further comprising:
   at least one fan disposed adjacent to the at least one first opening, the at least one fan configured to promote movement of the heated exhaust air through the at least one first opening.

9. The power distribution center of claim 1, wherein the at least one exhaust air duct is insulated.

10. The power distribution center of claim 1, wherein the at least one first opening is disposed vertically higher in the power distribution center than the one or more UPS modules and the one or more battery racks.

11. A method comprising:
    receiving, through at least one second opening of multiple openings disposed in multiple walls of a power distribution center, cooling air from outside the power distribution center and conveying the cooling air to one or more uninterruptible power supply (UPS) modules and one or more battery racks disposed within the power distribution center;
    transferring thermal energy to the cooling air from the one or more UPS modules and the one or more battery racks, thereby creating heated exhaust air;
    receiving the heated exhaust air from the one or more UPS modules and one or more battery racks by at least one exhaust air duct disposed above the one or more UPS modules and the one or more battery racks; and
    conveying the heated exhaust air to an outlet aligned with at least one first opening of the multiple openings in order to expel the heated exhaust air to an exterior space.

12. The method of claim 11, wherein the at least one exhaust air duct is adjustable in elevation above the one or more UPS modules and the one or more battery racks.

13. The method of claim 11, wherein the at least one exhaust air duct is mounted to one or more adjustable sliding rails disposed on at least one of the multiple walls, wherein the one or more adjustable sliding rails are configured to enable an adjustment in elevation of the at least one exhaust air duct.

14. The method of claim 11, wherein the cooling air is received from a data center adjacent to the power distribution center.

15. The method of claim 14, wherein the cooling air flows from the data center to the power distribution center due to a positive air pressure differential between the data center and the power distribution center.

16. The method of claim 11, wherein a first exhaust air duct of the at least one exhaust air duct comprises a flexible air dam disposed between the first exhaust air duct and a first UPS module of the one or more UPS modules, the flexible air dam conforming to at least one exterior surface of the first UPS module.

17. The method of claim 11, further comprising:
    cooling, by a cooling coil aligned with the at least one second opening, the cooling air as the cooling air is received into the power distribution center.

18. The method of claim 11, further comprising:
    promoting, by at least one fan disposed adjacent to the at least one first opening, movement of the heated exhaust air through the at least one first opening.

19. The method of claim 11, wherein the at least one exhaust air duct is insulated.

20. The method of claim 11, wherein the at least one first opening is disposed vertically higher in the power distribution center than the one or more UPS modules and the one or more battery racks.

* * * * *